United States Patent
Eid et al.

(10) Patent No.: US 10,544,033 B2
(45) Date of Patent: Jan. 28, 2020

(54) MICROMECHANICAL COMPONENT

(71) Applicant: Robert Bosch GmbH, Stuttgart (DE)

(72) Inventors: Rudy Eid, Stuttgart (DE); Stefano Cardanobile, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/301,948

(22) PCT Filed: May 10, 2017

(86) PCT No.: PCT/EP2017/061143
§ 371 (c)(1),
(2) Date: Nov. 15, 2018

(87) PCT Pub. No.: WO2017/198510
PCT Pub. Date: Nov. 23, 2017

(65) Prior Publication Data
US 2019/0284043 A1    Sep. 19, 2019

(30) Foreign Application Priority Data

May 18, 2016    (DE) .......................... 10 2016 208 503

(51) Int. Cl.
*B81B 7/00*    (2006.01)
(52) U.S. Cl.
CPC .... *B81B 7/0054* (2013.01); *B81B 2203/0163* (2013.01)
(58) Field of Classification Search
None
See application file for complete search history.

(56) References Cited

U.S. PATENT DOCUMENTS

| 9,891,052 B2 * | 2/2018 | Rinkio | G01C 19/5712 |
| 2006/0156814 A1 * | 7/2006 | Blomqvist | G01C 19/5712 73/504.12 |
| 2014/0144232 A1 * | 5/2014 | Lin | B81B 3/0051 73/504.12 |
| 2016/0187137 A1 * | 6/2016 | Rinkio | G01C 19/5712 73/504.12 |

FOREIGN PATENT DOCUMENTS

| DE | 102013208828 A1 | 11/2014 |
| EP | 2527789 A1 | 11/2012 |

OTHER PUBLICATIONS

International Search Report for PCT/EP2017/061143, dated Aug. 9, 2017.

* cited by examiner

*Primary Examiner* — J. E. Schoenholtz
(74) *Attorney, Agent, or Firm* — Norton Rose Fulbright US LLP; Gerard Messina

(57) ABSTRACT

A micromechanical component includes a substrate that extends along a main extension plane of the micromechanical component, the micromechanical component including a drive mass which is suspended on the substrate via a drive spring of the micromechanical component so as to be able to move relative to the substrate, the micromechanical component including a test mass that is movably suspended relative to the drive mass, the drive spring being disposed in such a way that the drive mass and/or the test mass surround(s) the drive spring at least in part essentially parallel to the main extension plane.

16 Claims, 3 Drawing Sheets

MICROMECHANICAL COMPONENT

FIELD OF THE INVENTION

The present invention is based on a micromechanical component.

BACKGROUND INFORMATION

Micromechanical components having a drive mass that is suspended on a substrate via a drive spring such that the drive mass is able to move relative to the substrate, and a test mass that is movably suspended in relation to the drive mass are generally known. The use of such a configuration makes it possible for micromechanical components to detect yaw rates present at the micromechanical component by utilizing the Coriolis force. For this purpose, the test mass is set into a periodic motion, with the result that the yaw rate present at the micromechanical component perpendicular to the periodic movement causes a force to act on the test mass that is orthogonal to the movement direction of the periodic movement and to the applied yaw rate, and this force effect is able to be measured with the aid of capacitive electrodes. As a result, it is possible to infer the existing yaw rate.

SUMMARY OF THE INVENTION

It is an object of the present invention to provide a micromechanical component that is mechanically robust, simple and cost-effective in comparison with the related art.

This objective may be achieved by placing the drive spring in such a way that the drive mass and/or the test mass enclose(s) the drive spring at least in part essentially parallel to the main extension plane.

This advantageously makes it possible to attach the drive spring to the substrate, in comparison to the related art, closer to a center of mass of the micromechanical component or closer to an axis of symmetry that extends through the center of mass of the micromechanical component and in the direction of a drive direction. Such an attachment of the drive spring on the substrate reduces the stress sensitivity of the micromechanical component in that a deformation of the substrate caused by an elongation due to thermal and mechanical loading, for example, deforms the attachment of the drive spring, and thus also the drive spring itself, or dislodges it from an intended ideal position to a lesser extent than in the related art. This provides a particularly precise function of the drive spring in comparison with the related art.

As a result, the present invention provides a micromechanical component in which a deformation of the substrate by elongation due to thermal and mechanical loading is less critical. A central suspension of the drive spring reduces the stress sensitivity of yaw rate sensors in comparison with the related art.

Therefore, a micromechanical component is provided which is mechanically robust, simple and cost-effective compared to the related art.

The micromechanical component may include a yaw rate sensor. As a result, it is possible to reduce the stress sensitivity of yaw rate sensors in the offset and quadrature in comparison with the related art.

Advantageous embodiments and further developments of the present invention may be gathered from the dependent claims as well as from the description with reference to the figures.

According to a further development, the drive spring is attached to the substrate via an anchor point; the anchor point is situated less than three-twelfths, which may be less than two-twelfths, and may be, less than one-twelfth of an extension of the drive mass essentially perpendicular to an axis of symmetry that extends through the center of mass of the micromechanical component and in the direction of a drive direction essentially parallel to the main extension plane, at a distance from the axis of symmetry essentially perpendicular to the axis of symmetry and essentially parallel to the main extension plane. This allows for a particularly compact and simple suspension of the drive spring and thus provides a micromechanical component that is particularly insensitive to stress.

According to a further development, the drive spring is attached to the substrate via a further anchor point; the further anchor point is situated less than three-twelfths, which may be less than two-twelfths, and may be, less than one-twelfth of the extension of the drive mass essentially perpendicular to the axis of symmetry and essentially parallel to the main extension plane, at a distance from the axis of symmetry essentially perpendicular to the axis of symmetry and essentially parallel to the main extension plane. This allows for a particularly compact and simple suspension of the drive spring at two anchor points, and thus for a spring construction of the drive spring that is selectively adapted to the operation of the micromechanical component, and at the same time, it allows for a micromechanical component that is particularly insensitive to stress.

According to a further development, the micromechanical component includes an additional drive spring such that the drive mass is movably suspended via the additional drive spring in relation to the substrate, and the additional drive spring is positioned in such a way that the drive mass and/or the test mass enclose(s) the additional drive spring at least in part essentially parallel to the main extension plane. This advantageously makes it possible to attach the additional drive spring to the substrate closer to a center of mass of the micromechanical component or closer to the axis of symmetry on the substrate in comparison with the related art. Due to an attachment of the additional drive spring on the substrate in such a position, the stress sensitivity of the micromechanical component is further reduced and a development of the micromechanical component with two drive springs that is in symmetry with the axis of symmetry is possible at the same time.

According to a further development, the additional drive spring is attached to the substrate via a third anchor point; the third anchor point is situated less than three-twelfths, which may be less than two-twelfths, and may be, less than one-twelfth of the extension of the drive mass essentially perpendicular to the axis of symmetry and essentially parallel to the main extension plane, at a distance from the axis of symmetry essentially perpendicular to the axis of symmetry and essentially parallel to the main extension plane. This allows for a particularly compact and simple suspension of the additional drive spring, and thus for a micromechanical component having two drive springs that is particularly stress-resistant.

According to a further development, the additional drive spring is attached to the substrate via a fourth anchor point; the fourth anchor point is situated less than three-twelfths, which may be less than two-twelfths, and may be, less than one-twelfth of the extension of the drive mass essentially perpendicular to the axis of symmetry and essentially parallel to the main extension plane, at a distance from the axis of symmetry essentially perpendicular to the axis of symmetry and essentially parallel to the main extension plane. This allows for a particularly compact and simple suspension of the additional drive spring at two anchor points, and thus for a spring construction of the additional drive spring that is selectively adapted to the operation of the micromechanical component, and at the same time, it provides a micromechanical component that is particularly stress-resistant.

According to a further development, the micromechanical component includes an electrically active drive for driving the drive mass, the drive being situated closer to a center of mass of the micromechanical component than the drive spring and/or the additional drive spring. This allows for a particularly compact and simultaneously stress-resistant micromechanical component.

According to a further development, the micromechanical component includes an electrically active drive for driving the drive mass, the drive being disposed farther away from a center of mass of the micromechanical component than the drive spring and/or the further drive spring. This provides a particularly compact and simultaneously particularly stress-resistant micromechanical component.

According to a further development, the drive mass includes a rocker structure. This advantageously allows for a mechanical synchronization of a first part of the drive mass and a second part of the drive mass. In particular, an opposite-phase oscillation of the first part of the drive mass and the second part of the drive and, simultaneously, a reduction of interference modes are possible in this manner.

According to a further development, the rocker structure is suspended on the substrate via a rocker spring of the micromechanical component in a manner that allows it to move in relation to the substrate. The rocker spring may be situated in such a way that the drive mass and/or the test mass enclose(s) the rocker spring at least in part essentially parallel to the main extension plane. In this way, a particularly compact and stress-resistant micromechanical component is able to be achieved.

Identical parts have always been provided with the same reference numerals in the various figures and are therefore also denoted or mentioned only once as a rule.

DETAILED DESCRIPTION

Figure 1:
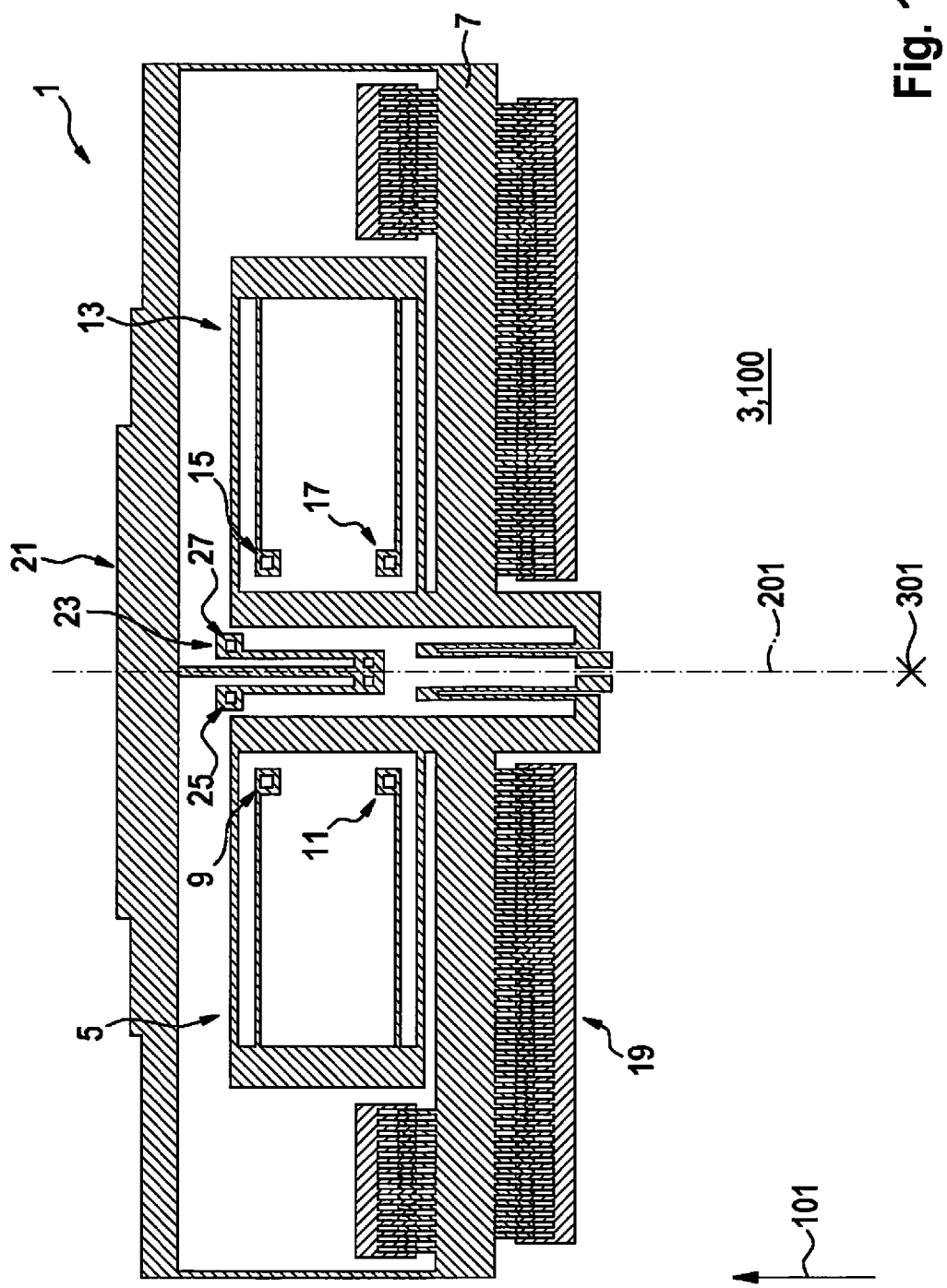
FIG. 1 shows an exemplary embodiment of the present invention in a schematized illustration.
Figure 2:
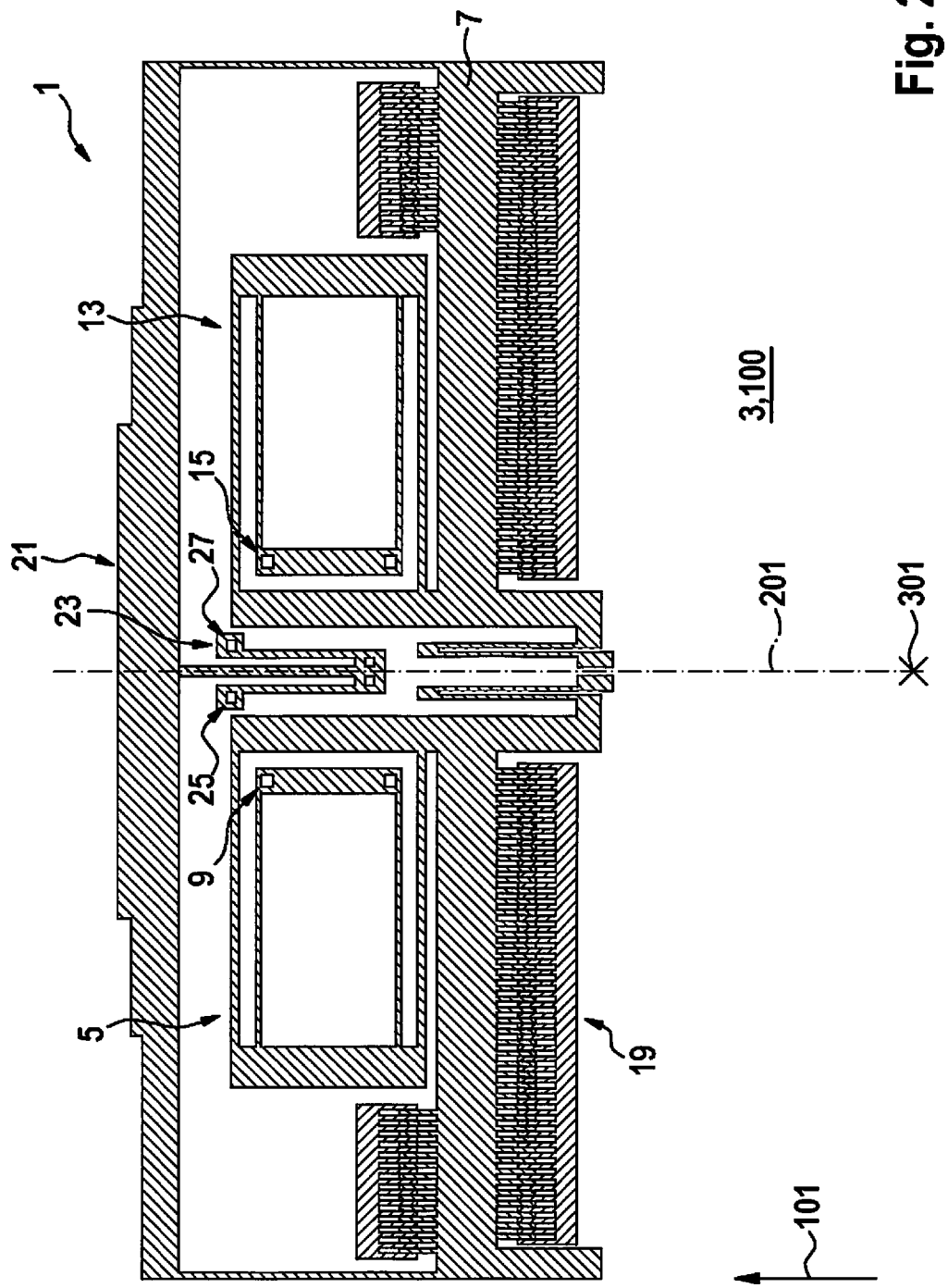
FIG. 2 shows an exemplary embodiment of the present invention in a schematized illustration.
Figure 3:
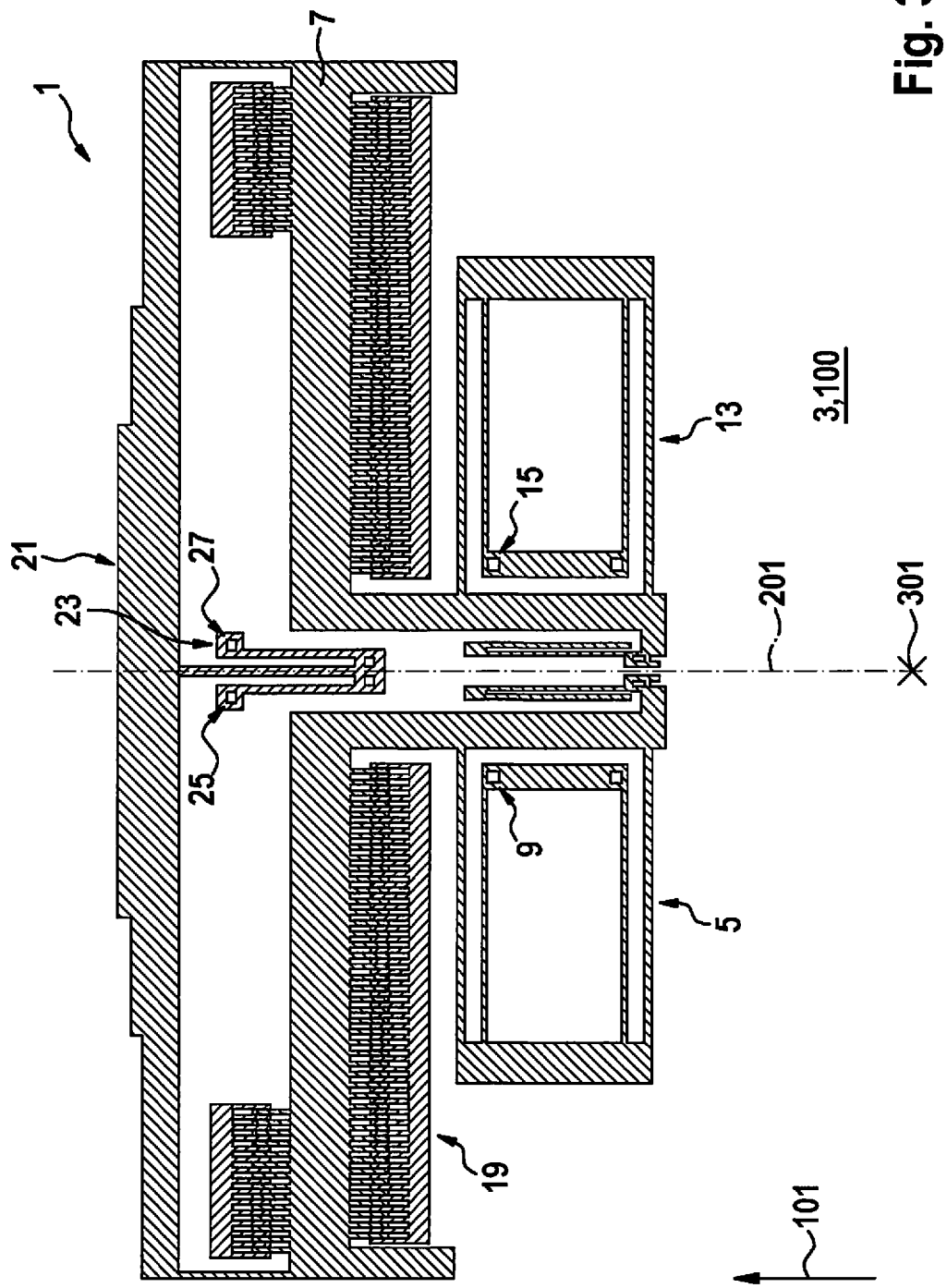
FIG. 3 shows an exemplary embodiment of the present invention in a schematized illustration.

FIG. 1, FIG. 2, and FIG. 3 show exemplary embodiments of the present invention in schematized illustrations.

FIG. 1, FIG. 2, and FIG. 3 in each case show a micromechanical component 1 having a substrate 3 that extends along a main extension plane 100 of micromechanical component 1. In addition, FIG. 1, FIG. 2, and FIG. 3 illustrate that the respective micromechanical component 1 includes a drive mass 7 which is suspended on substrate 3 via a drive spring 5 of micromechanical component 1 in a manner that allows it to move in relation to substrate 3. Furthermore, micromechanical component 1 has a test mass, which is not shown in FIG. 1, FIG. 2, and FIG. 3 and is suspended in a manner that allows it to move in relation to drive mass 7. The test mass may be situated on a side of drive mass 7 that is disposed counter to a drive direction 101 and is coupled with drive mass 7 by springs. According to the invention, drive spring 5 shown in FIG. 1, FIG. 2, and FIG. 3 is disposed in such a way that drive mass 7 and/or the test mass enclose(s) drive spring 5 at least in part essentially parallel to main extension plane 100. Drive mass 7 and/or the test mass may surround(s) drive spring 5 in such a way that drive spring 5 is completely surrounded either by drive mass 7 or by the test mass or by drive mass 7 and by the test mass in a plane that extends parallel to main extension plane 100.

In addition, FIG. 1, FIG. 2, and FIG. 3 show by way of example that drive spring 5 is attached to substrate 3 via an anchor point 9. It is exemplarily shown there that anchor point 9 is situated less than one-twelfth of an extension of drive mass 7 essentially perpendicular to an axis of symmetry 201 that extends through center of mass 301 of micromechanical component 1 and in the direction of a drive direction 101 and essentially parallel to main extension plane 100, at a distance from axis of symmetry 201 essentially perpendicular to axis of symmetry 201 and essentially parallel to main extension plane 100. Alternatively, for example, it is also provided that anchor point 9 is disposed less than three-twelfths, which may be less than two-twelfths, of an extension of drive mass 7 essentially perpendicular to axis of symmetry 201 and essentially parallel to main extension plane 100, at a distance from axis of symmetry 201 essentially perpendicular to axis of symmetry 201 and essentially parallel to main extension plane 100.

In addition, it is shown in FIG. 1 by way of example that drive spring 5 is attached to substrate 3 via a further anchor point 11; the further anchor point 11 is situated less than one-twelfth of the extension of drive mass 7 essentially perpendicular to axis of symmetry 201 and essentially parallel to main extension plane 100, at a distance from axis of symmetry 201 essentially perpendicular to axis of symmetry 201 and essentially parallel to main extension plane 100. Alternatively, for example, it is also provided that further anchor point 11 is situated less than three-twelfths, and which may be less than two-twelfths, of the extension of drive mass 7 essentially perpendicular to axis of symmetry 201 and essentially parallel to main extension plane 100, at a distance from axis of symmetry 201 essentially perpendicular to axis of symmetry 201 and essentially parallel to main extension plane 100.

FIG. 1, FIG. 2, and FIG. 3 illustrate by way of example that the individual micromechanical component 1 includes a further drive spring 13 such that drive mass 7 is suspended via further drive spring 13 in a manner that allows the drive mass to move relative to substrate 3. For example, further drive spring 13 is situated in such a way that drive mass 7 and/or the test mass enclose(s) further drive spring 13 at least in part essentially parallel to main extension plane 100. Further drive spring 13 is attached to substrate 3 via a third anchor point 15; third anchor point 15 is situated less than one-twelfth of the extension of drive mass 7 essentially perpendicular to axis of symmetry 201 and essentially parallel to main extension plane 100, at a distance from axis of symmetry 201 essentially perpendicular to axis of symmetry 201 and essentially parallel to main extension plane 100. Alternatively, it is also provided that third anchor point 15 is situated less than three-twelfths, and which may be less than two-twelfths, of the extension of drive mass 7 essentially perpendicular to axis of symmetry 201 and essentially parallel to main extension plane 100, at a distance from axis of symmetry 201 essentially perpendicular to axis of symmetry 201 and essentially parallel to main extension plane 100.

In micromechanical component 1 shown by way of example in FIG. 1, further drive spring 13 is attached to substrate 3 via a fourth anchor point 17. Here, fourth anchor point 17 is situated less than one-twelfth of the extension of drive mass 7 essentially perpendicular to axis of symmetry 201 and essentially parallel to main extension plane 100, at a distance from axis of symmetry 201 essentially perpendicular to axis of symmetry 201 and essentially parallel to main extension plane 100. As an alternative, it is also provided that fourth anchor point 17 is situated less than three-twelfths, and which may be less than two twelfths, of the extension of drive mass 7 essentially perpendicular to axis of symmetry 201 and essentially parallel to main extension plane 100, at a distance from axis of symmetry 201 essentially perpendicular to axis of symmetry 201 and essentially parallel to main extension plane 100.

Micromechanical components 1 shown in FIG. 1, FIG. 2 and FIG. 3 by way of example include an electrically active drive 19 for driving drive mass 7 in each case. It is illustrated in FIG. 1 and FIG. 2 by way of example that drive 19 is situated closer to center of mass 301 of micromechanical component 1 than drive spring 5 and further drive spring 13. In addition, it is exemplarily shown in FIG. 3 that drive 19 is disposed at a greater distance from center of mass 301 of micromechanical component 1 than drive spring 5 and further drive spring 13. In other words, according to the present invention it is exemplarily provided that the drive springs are suspended in the center of the sensor or as closely as possible to center of mass 301 of micromechanical component 1. According to the present invention, this is provided, for example, in the image plane of FIG. 1, FIG. 2 and FIG. 3 above or below electrically active drive 19.

By way of example, drive 19 includes two comb structures that are anchored in substrate 3, the anchored comb structures being developed to be rigid in relation to substrate 3. The comb structures of drive 19 engage with two comb structures of drive mass 7, a first comb structure of the first part of drive mass 7 and a second comb structure of the second part of drive mass 7, causing an antiparallel deflection of the first part of drive mass 7 and the second part of drive mass 7 through a selective control.

In addition, it is also shown in FIG. 1, FIG. 2 and FIG. 3 that the respective micromechanical component 1 includes a drive-detection unit that has two drive-detection comb structures firmly anchored in substrate 3. The drive-detection comb structures engage with two further comb structures of drive mass 7. This makes it possible to detect a deflection of drive mass 7 and allows for a selective control of drive 19 of drive mass 7 via a closed-loop control.

Moreover, in the case of micromechanical components 1 shown by way of example in FIG. 1, FIG. 2 and FIG. 3, drive mass 7 includes a rocker structure 21, rocker structure 21 being suspended on substrate 3 via a rocker spring 23 of micromechanical component 1 in a manner that allows it to move in relation to substrate 3.

It is shown by way of example in FIG. 1, FIG. 2, and FIG. 3 that drive spring 5 and further drive spring 13 have four spring legs in each case. Each one of the four spring legs may include a flexible spring. Two spring legs of drive spring 5 and of further drive spring 13 are connected to drive mass 7 and to an individual flexurally resistant bar of drive spring 5 and further drive spring 13 in each case. In addition, two further spring legs of drive spring 5 and of further drive spring 13 are connected to the flexurally resistant bar of drive spring 5 and of further drive spring 13 and to substrate 3.

FIG. 1 illustrates by way of example that a first spring leg of the two further spring legs of drive spring 5 is attached to substrate 3 via anchor point 9, and a second spring leg of the two further spring legs of drive spring 5 is attached to substrate 3 via further anchor point 11. In addition, FIG. 1 illustrates by way of example that a third spring leg of the two further spring legs of further drive spring 13 is attached to substrate 3 via third anchor point 15, and a fourth spring leg of the two further spring legs of further drive spring 13 is attached to substrate 3 via fourth anchor point 17.

FIG. 2 and FIG. 3 illustrate by way of example that the first spring leg of the two further spring legs of drive spring 5 is attached to substrate 3 via anchor point 9, and the second spring leg of the two further spring legs of drive spring 5 is also attached to substrate 3 via anchor point 9. FIG. 2 and FIG. 3 also show that the third spring leg of the two further spring legs of further drive spring 13 is attached to substrate 3 via third anchor point 15, and the fourth spring leg of the two further spring legs of further drive spring 13 is also attached to substrate 3 via third anchor point 15. In other words, the spring legs are anchored in the same substrate point. In this way the suspension points of the drive springs are situated closer to the geometrical center of the sensor, which leads to a reduction of the effect of substrate distortions.

Rocker spring 23 shown in FIG. 1, FIG. 2 and FIG. 3 by way of example includes three spring legs, the three spring legs including a spiral spring in each case. One spring leg of rocker spring 23 is connected to drive mass 7 and to a flexurally resistant bar of rocker spring 23. In addition, a further and a third spring leg of rocker spring 23 is connected to the flexurally resistant bar of rocker spring 23 and to substrate 3 in each case. The further spring leg of rocker spring 23 is attached to substrate 3 via a fifth anchor point 25, and the third spring leg of rocker spring 23 is attached to substrate 3 via a sixth anchor point 27.

In FIG. 1, FIG. 2 and FIG. 3 it is shown by way of example that the spring leg, the further spring leg, and the third spring leg of rocker spring 23 are disposed essentially parallel to axis of symmetry 201, and the spring bars of drive spring 5 and further drive spring 13 are disposed essentially perpendicular to axis of symmetry 201. This advantageously allows for an antiparallel deflection of the first part of drive mass 7 and the second part of drive mass 7 and for a rocking motion of rocker structure 21.

In addition, it is shown in FIG. 1, FIG. 2 and FIG. 3 by way of example that the further spring leg and the third spring leg of rocker spring 23 are situated less than one-sixtieth, and which may be less than one-sixty-fifth and, may be, less than one-eighty-first, of the extension of drive mass 7 essentially perpendicular to axis of symmetry 201 and essentially parallel to main extension plane 100, at a distance from the axis of symmetry 201 essentially perpendicular to axis of symmetry 201 and essentially parallel to main extension plane 100. This provides a particularly stress-resistant and compact micromechanical component 1.

Furthermore, it is shown in FIG. 1, FIG. 2 and FIG. 3 by way of example that fifth anchor point 25 and sixth anchor point 27 are disposed less than one-sixtieth, and which may be less than one-sixty-fifth, and may be, less than one-eighty-first, of the extension of drive mass 7 essentially perpendicular to axis of symmetry 201 and essentially parallel to main extension plane 100, at a distance from the axis of symmetry 201 essentially perpendicular to axis of symmetry 201 and essentially parallel to main extension plane 100. This provides a particularly stress-resistant and compact micromechanical component 1.

In addition to the test mass, micromechanical component 1 may include a further test mass. The test mass may be coupled to the first part of drive mass 7 by one or more spring(s), and the further test mass is coupled to the second part of drive mass 7 by one or more spring(s) in such a way that a force effect is detectable that is present at the test mass and the further test mass essentially perpendicular to drive direction 101, on account of a yaw rate present at micromechanical component 1. This advantageously allows for a differential detection of a yaw rate using micromechanical component 1 according to the present invention.

In addition, the micromechanical components 1 according to the present invention shown in FIG. 1, FIG. 2 and FIG. 3 may include a further structure in each case, the respective further structure essentially corresponding to the structure shown in FIG. 1, FIG. 2 and FIG. 3. The further structure may be developed and positioned in such a way that the further structure corresponds to a mirror image of the structure shown in FIG. 1, FIG. 2 and FIG. 3, the mirror image being produced by a mirror plane that extends perpendicular to main extension plane 100 and perpendicular to axis of symmetry 201.

In addition to drive spring 5 and further drive spring 13, micromechanical component 1 may include a third drive spring and a fourth drive spring. In other words, micromechanical component 1 has four main springs having two anchor points in each case, the anchor points being essentially positioned and developed as described earlier. According to the present invention, the anchor points may be situated less than three-twelfths, which may be less than two-twelfths and may be less than one-twelfth, of the extension of drive mass 7 essentially perpendicular to axis of symmetry 201 and essentially parallel to main extension plane 100, at a distance from axis of symmetry 201 essentially perpendicular to axis of symmetry 201 and essentially parallel to main extension plane 100. As a result, an offset of these anchor points because of variable mechanical or thermal loading of substrate 3 is advantageously reduced, which means that an effect of variable mechanical or thermal loading of substrate 3 on correction parameters, e.g., for the calibration of micromechanical component 1, is reduced as well. In particular, this offset is advantageously reduced in that the anchor points, in particular anchor point 9, further anchor point 11, third anchor point 15, fourth anchor point 17, fifth anchor point 25, and sixth anchor point 27, and also the particular anchor points of the further structure are brought closer together than in the related art or are disposed closer to the geometrical center of the sensor or to center of mass 301 of micromechanical component 1. A micromechanical component 1 having a drive concept is therefore provided in which the suspension of the drive springs is placed centrically above or below, and the movement from drive 19 to the test masses is transmitted with the aid of a coupling structure or with the aid of drive mass 7 or two drive masses and springs between drive mass 7 or drive masses and the test mass or test masses.

What is claimed is:

1. A micromechanical component, comprising:
   a substrate that extends along a main extension plane of the micromechanical component;
   a drive mass which is suspended on the substrate via a drive spring of the micromechanical component so as to be movable relative to the substrate; and
   a test mass which is suspended so as to be movable relative to the drive mass;
   wherein the drive spring is positioned so that the drive mass and/or the test mass encloses the drive spring at least in part essentially parallel to the main extension plane,
   wherein an extension of the drive mass is a total distance from one end of a drive mass to an opposite end of the drive mass, the total distance being measured in the main extension plane and perpendicular to an axis of symmetry, the axis of symmetry extending through a center of mass of the micromechanical component and in a direction of a drive direction and essentially parallel to the main extension direction,
   wherein the drive mass includes a rocker structure, and wherein the rocker structure is suspended on the substrate via a rocker spring of the micromechanical component in a movable manner relative to the substrate.

2. The micromechanical component of claim 1, wherein the drive spring is attached to the substrate via an anchor point, the anchor point being situated less than three-twelfths of the extension of the drive mass, and wherein the three-twelfths of the extension of drive mass is measured as a distance from the axis of symmetry.

3. A micromechanical component, comprising:
   a substrate that extends along a main extension plane of the micromechanical component;
   a drive mass which is suspended on the substrate via a drive spring of the micromechanical component so as to be movable relative to the substrate; and
   a test mass which is suspended so as to be movable relative to the drive mass;
   wherein the drive spring is positioned so that the drive mass and/or the test mass encloses the drive spring at least in part essentially parallel to the main extension plane,
   wherein an extension of the drive mass is a total distance from one end of a drive mass to an opposite end of the drive mass, the total distance being measured in the main extension plane and perpendicular to an axis of symmetry, the axis of symmetry extending through a center of mass of the micromechanical component and in a direction of a drive direction and essentially parallel to the main extension direction, and
   wherein the drive spring is attached to the substrate via a further anchor point, the further anchor point being situated less than three-twelfths of the extension of the drive mass, and wherein the three-twelfths of the extension of drive mass is measured as a distance from the axis of symmetry.

4. The micromechanical component of claim 1, wherein the micromechanical component includes a further drive spring so that the drive mass is movably suspended in relation to the substrate via the further drive spring, the further drive spring being situated so that the drive mass and/or the test mass encloses the further drive spring at least in part essentially parallel to the main extension plane.

5. A micromechanical component, comprising:
   a substrate that extends along a main extension plane of the micromechanical component;
   a drive mass which is suspended on the substrate via a drive spring of the micromechanical component so as to be movable relative to the substrate; and
   a test mass which is suspended so as to be movable relative to the drive mass;

wherein the drive spring is positioned so that the drive mass and/or the test mass encloses the drive spring at least in part essentially parallel to the main extension plane, wherein an extension of the drive mass is a total distance from one end of a drive mass to an opposite end of the drive mass, the total distance being measured in the main extension plane and perpendicular to an axis of symmetry, the axis of symmetry extending through a center of mass of the micromechanical component and in a direction of a drive direction and essentially parallel to the main extension direction, and wherein the further drive spring is attached to the substrate via a third anchor point, the third anchor point being situated less than three-twelfths of the extension of the drive mass, and wherein the three-twelfths of the extension of drive mass is measured as a distance from the axis of symmetry.

6. A micromechanical component, comprising:
a substrate that extends along a main extension plane of the micromechanical component;
a drive mass which is suspended on the substrate via a drive spring of the micromechanical component so as to be movable relative to the substrate; and
a test mass which is suspended so as to be movable relative to the drive mass;
wherein the drive spring is positioned so that the drive mass and/or the test mass encloses the drive spring at least in part essentially parallel to the main extension plane, wherein an extension of the drive mass is a total distance from one end of a drive mass to an opposite end of the drive mass, the total distance being measured in the main extension plane and perpendicular to an axis of symmetry, the axis of symmetry extending through a center of mass of the micromechanical component and in a direction of a drive direction and essentially parallel to the main extension direction, and
wherein the further drive spring is attached to the substrate via a fourth anchor point, the fourth anchor point being situated less than three-twelfths of the extension of the drive mass, and wherein the three-twelfths of the extension of drive mass is measured as a distance from the axis of symmetry.

7. The micromechanical component of claim 1, wherein the micromechanical component includes an electrically active drive for driving the drive mass, the drive being situated closer to a center of mass of the micromechanical component than the drive spring and/or the further drive spring.

8. The micromechanical component of claim 1, wherein the micromechanical component includes an electrically active drive for driving the drive mass, the drive being situated farther from a center of mass of the micromechanical component than the drive spring and/or the further drive spring.

9. The micromechanical component of claim 1, wherein the drive spring is attached to the substrate via an anchor point, the anchor point being situated less than two-twelfths of an extension of the drive mass, and wherein the two-twelfths of the extension of drive mass is measured as a distance from the axis of symmetry.

10. The micromechanical component of claim 1, wherein the drive spring is attached to the substrate via an anchor point, the anchor point being situated less than one-twelfth of an extension of the drive mass, and wherein the two-twelfths of the extension of drive mass is measured as a distance from the axis of symmetry.

11. A micromechanical component, comprising:
a substrate that extends along a main extension plane of the micromechanical component;
a drive mass which is suspended on the substrate via a drive spring of the micromechanical component so as to be movable relative to the substrate; and
a test mass which is suspended so as to be movable relative to the drive mass;
wherein the drive spring is positioned so that the drive mass and/or the test mass encloses the drive spring at least in part essentially parallel to the main extension plane,
wherein an extension of the drive mass is a total distance from one end of a drive mass to an opposite end of the drive mass, the total distance being measured in the main extension plane and perpendicular to an axis of symmetry, the axis of symmetry extending through a center of mass of the micromechanical component and in a direction of a drive direction and essentially parallel to the main extension direction, and
wherein the drive spring is attached to the substrate via a further anchor point, the further anchor point being situated less than two-twelfths of the extension of the drive mass, and wherein the two-twelfths of the extension of drive mass is measured as a distance from the axis of symmetry.

12. A micromechanical component, comprising:
a substrate that extends along a main extension plane of the micromechanical component;
a drive mass which is suspended on the substrate via a drive spring of the micromechanical component so as to be movable relative to the substrate; and
a test mass which is suspended so as to be movable relative to the drive mass;
wherein the drive spring is positioned so that the drive mass and/or the test mass encloses the drive spring at least in part essentially parallel to the main extension plane,
wherein an extension of the drive mass is a total distance from one end of a drive mass to an opposite end of the drive mass, the total distance being measured in the main extension plane and perpendicular to an axis of symmetry, the axis of symmetry extending through a center of mass of the micromechanical component and in a direction of a drive direction and essentially parallel to the main extension direction, and
wherein the drive spring is to the substrate via a further anchor point, the further anchor point being situated less than one-twelfth of the extension of the drive mass, and wherein the two-twelfths of the extension of drive mass is measured as a distance from the axis of symmetry.

13. A micromechanical component, comprising:
a substrate that extends along a main extension plane of the micromechanical component;
a drive mass which is suspended on the substrate via a drive spring of the micromechanical component so as to be movable relative to the substrate; and
a test mass which is suspended so as to be movable relative to the drive mass;
wherein the drive spring is positioned so that the drive mass and/or the test mass encloses the drive spring at least in part essentially parallel to the main extension plane,
wherein an extension of the drive mass is a total distance from one end of a drive mass to an opposite end of the drive mass, the total distance being measured in the main extension plane and perpendicular to an axis of symmetry, the axis of symmetry extending through a center of mass of the micromechanical component and in a direction of a drive direction and essentially parallel to the main extension direction, and wherein the further drive spring is attached to the substrate via a third anchor point, the third anchor point being situated less than two-twelfths of the extension of the drive mass, and wherein the two-twelfths of the extension of drive mass is measured as a distance from the axis of symmetry.

14. A micromechanical component, comprising:

a substrate that extends along a main extension plane of the micromechanical component;

a drive mass which is suspended on the substrate via a drive spring of the micromechanical component so as to be movable relative to the substrate; and a test mass which is suspended so as to be movable relative to the drive mass;

wherein the drive spring is positioned so that the drive mass and/or the test mass encloses the drive spring at least in part essentially parallel to the main extension plane, wherein an extension of the drive mass is a total distance from one end of a drive mass to an opposite end of the drive mass, the total distance being measured in the main extension plane and perpendicular to an axis of symmetry, the axis of symmetry extending through a center of mass of the micromechanical component and in a direction of a drive direction and essentially parallel to the main extension direction, and wherein the further drive spring is attached to the substrate via a third anchor point, the third anchor point being situated less than one-twelfth of the extension of the drive mass, and wherein the one-twelfth of the extension of drive mass is measured as a distance from the axis of symmetry.

15. A micromechanical component, comprising:

a substrate that extends along a main extension plane of the micromechanical component;

a drive mass which is suspended on the substrate via a drive spring of the micromechanical component so as to be movable relative to the substrate; and a test mass which is suspended so as to be movable relative to the drive mass;

wherein the drive spring is positioned so that the drive mass and/or the test mass encloses the drive spring at least in part essentially parallel to the main extension plane, wherein an extension of the drive mass is a total distance from one end of a drive mass to an opposite end of the drive mass, the total distance being measured in the main extension plane and perpendicular to an axis of symmetry, the axis of symmetry extending through a center of mass of the micromechanical component and in a direction of a drive direction and essentially parallel to the main extension direction, and wherein the further drive spring is attached to the substrate via a fourth anchor point, the fourth anchor point being situated less than two-twelfths of the extension of the drive mass, and wherein the two-twelfths of the extension of drive mass is measured as a distance from the axis of symmetry.

16. A micromechanical component, comprising:

a substrate that extends along a main extension plane of the micromechanical component;

a drive mass which is suspended on the substrate via a drive spring of the micromechanical component so as to be movable relative to the substrate; and a test mass which is suspended so as to be movable relative to the drive mass;

wherein the drive spring is positioned so that the drive mass and/or the test mass encloses the drive spring at least in part essentially parallel to the main extension plane, wherein an extension of the drive mass is a total distance from one end of a drive mass to an opposite end of the drive mass, the total distance being measured in the main extension plane and perpendicular to an axis of symmetry, the axis of symmetry extending through a center of mass of the micromechanical component and in a direction of a drive direction and essentially parallel to the main extension direction, and wherein the further drive spring is attached to the substrate via a fourth anchor point, the fourth anchor point being situated less than one-twelfth, of the extension of the drive mass, and wherein the one-twelfth of the extension of drive mass is measured as a distance from the axis of symmetry.

* * * * *